(12) United States Patent  
Han et al.

(10) Patent No.: US 9,939,670 B2
(45) Date of Patent: Apr. 10, 2018

(54) DISPLAY DEVICE HAVING IMPROVED ELECTRIC FIELD GENERATION

(71) Applicant: SAMSUNG DISPLAY CO., LTD., Yongin-si, Gyeonggi-do (KR)

(72) Inventors: Eun Hee Han, Seoul (KR); Hee-Keun Lee, Suwon-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

(21) Appl. No.: 15/062,984

(22) Filed: Mar. 7, 2016

(65) Prior Publication Data

US 2016/0313598 A1 Oct. 27, 2016

(30) Foreign Application Priority Data

Apr. 21, 2015 (KR) .................. 10-2015-0056031

(51) Int. Cl.
*G02F 1/1333* (2006.01)
*G02F 1/1362* (2006.01)
*G02F 1/1343* (2006.01)
*G02F 1/1368* (2006.01)
*G02F 1/1341* (2006.01)
*H01L 27/12* (2006.01)

(52) U.S. Cl.
CPC .. *G02F 1/133377* (2013.01); *G02F 1/134309* (2013.01); *G02F 1/134363* (2013.01); *H01L 27/124* (2013.01); *H01L 27/1259* (2013.01); *G02F 1/13439* (2013.01); *G02F 1/136286* (2013.01); *G02F 2001/134318* (2013.01); *G02F 2001/136295* (2013.01)

(58) Field of Classification Search
None
See application file for complete search history.

(56) References Cited

U.S. PATENT DOCUMENTS

2011/0260169 A1* 10/2011 Umezaki ............. H01L 27/3276
257/59
2012/0062448 A1* 3/2012 Kim ................... G02F 1/133377
345/55
2014/0198290 A1* 7/2014 Lim ................... G02F 1/133377
349/143

FOREIGN PATENT DOCUMENTS

| JP | 2009-115930 A | 5/2009 |
| KR | 10-2008-0002285 A | 1/2008 |
| KR | 10-2012-0026880 A | 3/2012 |
| KR | 10-2014-0089650 A | 7/2014 |

* cited by examiner

*Primary Examiner* — Ashok Patel
(74) *Attorney, Agent, or Firm* — Innovation Counsel LLP

(57) ABSTRACT

The present invention relates to a display device capable of more stably forming a horizontal electric field. A display device according to an exemplary embodiment of the present invention includes a substrate; a thin film transistor disposed on the substrate; a microcavity having a first side, a second side opposite to the first side, and an upper surface extending between the first side and the second side; a pixel electrode connected to the thin film transistor and positioned along the first side; a common electrode extending along the second side; a roof layer covering the pixel electrode, the common electrode, and the upper surface of the microcavity; and a liquid crystal layer disposed in the microcavity.

10 Claims, 13 Drawing Sheets

DISPLAY DEVICE HAVING IMPROVED ELECTRIC FIELD GENERATION

CROSS-REFERENCE TO RELATED APPLICATION

This application claims priority to, and the benefit of, Korean Patent Application No. 10-2015-0056031 filed in the Korean Intellectual Property Office on Apr. 21, 2015, the entire contents of which are incorporated herein by reference.

BACKGROUND (a) Technical Field

Embodiments of the present invention relate generally to display devices. More particularly, embodiments of the present invention relate to display devices having improved electric field generation.

(b) Description of the Related Art

Liquid crystal displays are one type of flat panel display that has found wide acceptance. A liquid crystal display has two display panels on which field generating electrodes such as pixel electrodes and a common electrode are formed, and a liquid crystal layer that is interposed between the panels. Voltages are applied to the field generating electrodes so as to generate an electric field in the liquid crystal layer, and the alignment of liquid crystal molecules of the liquid crystal layer is determined by this electric field. Accordingly, the polarization of incident light is controlled, thereby performing image display.

The two display panels forming the liquid crystal display may be a thin film transistor array panel and an opposing display panel. In the thin film transistor array panel, a gate line transmitting a gate signal and a data line transmitting a data signal are formed to cross each other, with a thin film transistor being connected to the gate line and the data line and a pixel electrode being connected to the thin film transistor. The opposing display panel may include a light blocking member, a color filter, a common electrode, etc. If necessary, the light blocking member, the color filter, and the common electrode may be formed in the thin film transistor array panel.

However, in the conventional liquid crystal display, two substrates are used, resulting in a display device that is excessively heavy, expensive to manufacture, and that requires excessive time to fabricate.

The above information disclosed in this Background section is only to enhance the understanding of the background of the invention and therefore it may contain information that does not form the prior art that is already known in this country to a person of ordinary skill in the art.

SUMMARY

Embodiments of the present invention provide a display device with reduced weight, thickness, cost, and process time by manufacturing the display device with one substrate.

In addition, embodiments of the present invention provide a display device capable of forming a more stable horizontal electric field.

A display device according to an exemplary embodiment of the present invention includes a substrate; a thin film transistor disposed on the substrate; a microcavity having a first side, a second side opposite to the first side, and an upper surface extending between the first side and the second side; a pixel electrode connected to the thin film transistor and positioned along the first side; a common electrode extending along the second side; a roof layer covering the pixel electrode, the common electrode, and the upper surface of the microcavity; and a liquid crystal layer disposed in the microcavity.

The display device may further include a gate line, a reference voltage line, and a data line positioned on the substrate. A first electrode may protrude from the reference voltage line and overlap the common electrode, and the common electrode may be connected to the first electrode.

The reference voltage line may be positioned in the same layer as the gate line and may extend in a direction parallel to the gate line.

The data line may extend in a direction parallel to the pixel electrode and the common electrode.

The common electrode may be positioned in the same layer as the pixel electrode.

A height of the pixel electrode may be greater than a thickness of the pixel electrode.

A height of the common electrode may be greater than a thickness of the pixel electrode.

The microcavity may be a first microcavity, the display device may further comprise a second microcavity having a first side and an opposite second side, the pixel electrode may be positioned along the first side of the second microcavity, and the common electrode may be positioned along the second side of the second microcavity.

The pixel electrode and the common electrode may each have a first portion oriented along a first direction and a second portion connected to the first portion and oriented along a second direction different from the first direction.

The data line may have a first portion oriented along a first direction and a second portion connected to the first portion and oriented along a second direction different from the first direction.

A method of manufacturing a display device according to an exemplary embodiment of the present invention includes forming a thin film transistor on a substrate; forming a passivation layer on the thin film transistor; forming a sacrificial layer on the passivation layer; forming a pixel electrode and a common electrode along opposite sides of the sacrificial layer; forming a roof layer on the pixel electrode, the common electrode, and the sacrificial layer; removing the sacrificial layer to form a microcavity; and injecting a liquid crystal material into the microcavity.

The method may further include forming a first contact hole in the passivation layer to expose at least a portion of the thin film transistor, and connecting the pixel electrode to the thin film transistor through the first contact hole.

The method may further include forming a reference voltage line and a first electrode on the substrate, the first electrode protruding from the reference voltage line; forming a second contact hole in the passivation layer to expose at least a portion of the first electrode, and connecting the common electrode to the first electrode through the second contact hole.

The method may further include forming a gate line and a data line on the substrate, and the reference voltage line and the first electrode may be positioned in the same layer as the gate line.

The reference voltage line may extend in the direction parallel to the gate line.

The pixel electrode and the common electrode may extend substantially parallel to each other.

The common electrode may be positioned in the same layer as the pixel electrode.

The height of the pixel electrode may be greater than the thickness of the pixel electrode.

The height of the common electrode may be greater than the thickness of the pixel electrode.

The pixel electrode and the common electrode may each have a first portion oriented along a first direction and a second portion connected to the first portion and oriented along a second direction different from the first direction.

A display device according to an exemplary embodiment of the present invention has the following effects.

A display device according to an exemplary embodiment of the present invention is manufactured by using one substrate such that weight, thickness, cost, and process time may be reduced.

Also, the pixel electrode and the common electrode are disposed at both sides of the microcavity, and the heights of the pixel electrode and the common electrode are larger than the thickness, thereby forming a stable electric field in the horizontal direction.

DETAILED DESCRIPTION OF THE EMBODIMENTS

Figure 1:
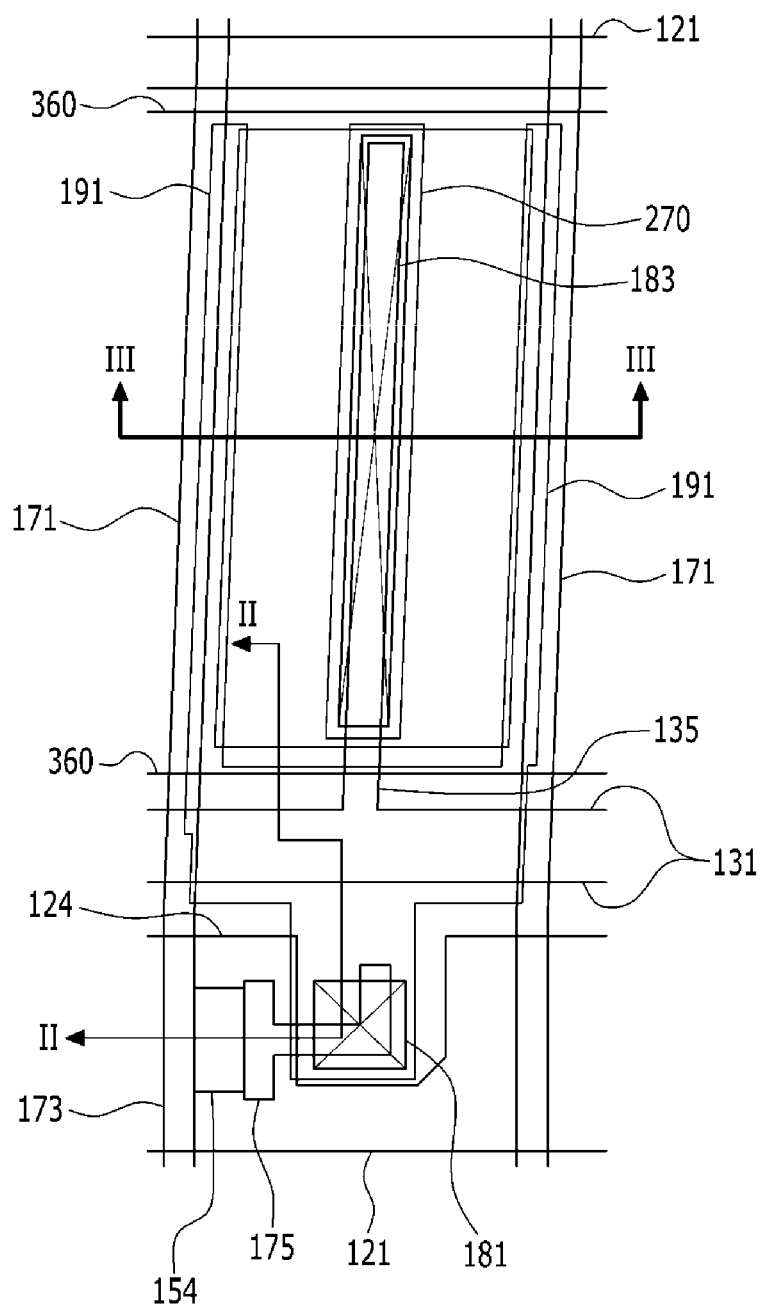
FIG. 1 is a plan view of one pixel of a display device according to an exemplary embodiment of the present invention.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In the drawings, the thickness of layers, films, panels, regions, etc., are exaggerated for clarity. The various Figures are thus not to scale. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

All numerical values are approximate, and may vary. All examples of specific materials and compositions are to be taken as nonlimiting and exemplary only. Other suitable materials and compositions may be used instead.

A display device according to an exemplary embodiment of the present invention will be described with reference to FIG. 1 to FIG. 3.

FIG. 1 is a plan view of one pixel of a display device according to an exemplary embodiment of the present invention; FIG. 2 is a cross-sectional view of a display device according to an exemplary embodiment of the present invention of FIG. 1, taken along line II-II; and FIG. 3 is a cross-sectional view of a display device according to an exemplary embodiment of the present invention of FIG. 1, taken along line Referring to FIG. 1 to FIG. 3, a gate line 121 and a gate electrode 124 protruding from the gate line 121 are formed on an insulation substrate 110 that is made of a material such as a transparent glass or plastic.

The gate line 121 transmits a gate signal and mainly extends in a horizontal direction.

Also, a reference voltage line 131 and a first electrode 135 protruding from the reference voltage line 131 are formed on the substrate 110. The reference voltage line 131 and the first electrode 135 may be positioned in the same layer as the gate line 121 and may be made of the same material as the gate line 121. The reference voltage line 131 extends generally parallel to the gate line 121. The first electrode 135 is oriented at a predetermined angle relative to the reference voltage line 131, and here extends in approximately a vertical direction.

The reference voltage line 131 transmits a predetermined voltage such as a common voltage. The first electrode 135 is connected to the reference voltage line 131, thereby receiving the predetermined voltage from the reference voltage line 131.

A gate insulating layer 140 is formed on the gate line 121 and the gate electrode 124. The gate insulating layer 140 may be made of an inorganic insulating material such as silicon nitride (SiNx) or silicon oxide (SiOx). Further, the gate insulating layer 140 may be made of a single layer or multiple layers.

A semiconductor 154 is formed on the gate insulating layer. The semiconductor 154 may be positioned on the gate electrode 124. If necessary, the semiconductor 154 may be positioned under the data line 171. The semiconductor 154 may be made of an amorphous silicon, a polycrystalline silicon, or a metal oxide.

An ohmic contact (not shown) may be further formed on the semiconductor 154. The ohmic contacts may be made of silicide or of n+hydrogenated amorphous silicon doped with an n-type impurity at a high concentration.

A data line 171 and a drain electrode 175 separated from the data line 171 are formed on the semiconductor 154 and the gate insulating layer 140. The data line 171 includes a source electrode 173 and the source electrode 173 and the drain electrode 175 are positioned to face to each other over the semiconductor 154.

The data line 171 transmits a data signal and mainly extends in a vertical direction, thereby crossing the gate line 121. The data line 171 may extend in the same direction as the first electrode 135.

As shown in FIG. 1, the source electrode 173 does not protrude from the data line 171, but may simply be a portion of the data line 171. The drain electrode 175 may include a rod-shaped portion extending substantially parallel to the source electrode 173 or data line 171, and an extension which is opposite thereto.

The gate electrode 124, the source electrode 173, and the drain electrode 175 collectively form a thin film transistor (TFT) along with the semiconductor 154. The thin film transistor may function as a switching element transmitting a data voltage of the data line 171. In this case, the channel of the thin film transistor is formed in the semiconductor 154 between the source electrode 173 and the drain electrode 175.

A passivation layer 180 is formed on the data line 171, the source electrode 173, the drain electrode 175, and the semiconductor 154 exposed between the source electrode 173 and the drain electrode 175. The passivation layer 180 may be made of an organic insulating material or an inorganic insulating material, and may be formed of a single layer or multiple layers.

A color filter 230 and a light blocking member 220 are formed on the passivation layer 180.

Color filters 230 are respectively positioned in a plurality of pixels, and each color filter 230 may display one primary color, such as one of the three primary colors red, green, and blue. The color filter 230 is not limited to the three primary colors red, green, and blue, and may also display cyan, magenta, yellow, and white-based colors. Any colors are contemplated.

The light blocking member 220 may be positioned on the boundary of the pixel. That is, the light blocking member 220 is formed in the region between adjacent color filters 230. The light blocking member 220 is formed on the boundary of the pixel and the thin film transistor to prevent light leakage.

A first insulating layer 240 may be further formed on the color filter 230 and the light blocking member 220. The first insulating layer 240 may be made of an organic insulating material and may have a function of flattening the upper surfaces of the color filter 230 and the light blocking member 220. The first insulating layer 240 may be made of a dual layer structure including a layer made of an organic insulating material and a layer made of an inorganic insulating material. Also, the first insulating layer 240 may be omitted if necessary.

A first contact hole 181 is formed through the passivation layer 180, the light blocking member 220, and the first insulating layer 240. The first contact hole 181 may expose at least a portion of the thin film transistor, particularly at least a portion of the drain electrode 175.

Also, a second contact hole 183 is formed through the gate insulating layer 140, the passivation layer 180, the color filter 230, and the first insulating layer 240. The second contact hole 183 may expose at least a portion of the first electrode 135.

A pixel electrode 191 and a common electrode 270 are formed on the first insulating layer 240. The pixel electrode 191 and the common electrode 270 may be positioned in the same layer and may be made of the same material. The pixel electrode 191 and the common electrode 270 may be made of a transparent metal oxide such as indium-tin oxide (ITO) or indium-zinc oxide (IZO). Also, the pixel electrode 191 and the common electrode 270 may be made of an opaque metal material.

Microcavities 305 are positioned between the pixel electrode 191 and the common electrode 270. That is, the pixel electrode 191 and the common electrode 270 are positioned at the side of the microcavities 305, and the microcavities 305 are enclosed by the pixel electrode 191 and the common electrode 270.

The pixel electrode 191 may be positioned at both edges of one pixel and may mainly extend in a vertical direction. The common electrode 270 may be positioned at the center of one pixel and may mainly extend in a vertical direction. That is, the pixel electrode 191 is positioned along two opposing sides of the common electrode 270. Each microcavity 305 is positioned between the pixel electrode 191 and one side of the common electrode 270. That is, two microcavities 305 divided by the common electrode 270 are positioned in one pixel. However, the present invention is not limited thereto, and more than two microcavities 305 may be positioned in one pixel.

Referring to FIG. 1, in plan view, the pixel electrode 191 and the common electrode 270 are each formed to have an elongated bar shape. The pixel electrode 191 and the common electrode 270 extend in a direction parallel to each other. Also, the pixel electrode 191 and the common electrode 270 may be elongated in a direction parallel to the data line 171 and may be extended in a direction parallel to the first electrode 135.

Figure 3:
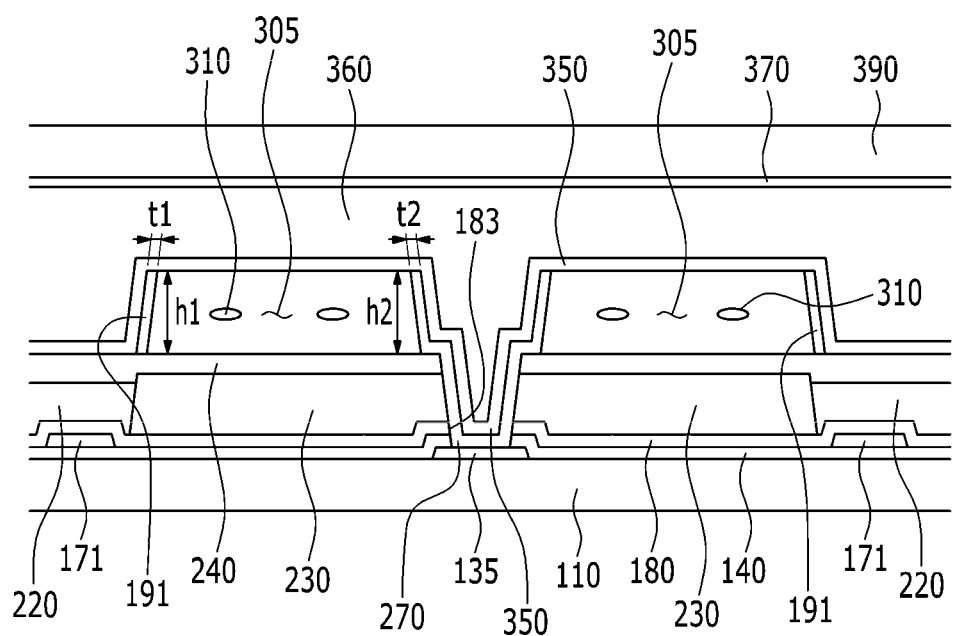
FIG. 3 is a cross-sectional view of a display device according to an exemplary embodiment of the present invention of FIG. 1, taken along line III-III

Referring to FIG. 3, in this cross-sectional view, the height h1 of the pixel electrode 191 is larger than its thickness t1 (i.e. the thickness of its material layer), and the height h2 of the common electrode 270 is also larger than its thickness t2. The height h1 of the pixel electrode 191 and the height h2 of the common electrode 270 correspond to both the height of the microcavity 305 and to a cell gap.

The pixel electrode 191 overlaps a portion of the drain electrode 175 and is connected to the drain electrode 175 through the first contact hole 181. Accordingly, the pixel electrode 191 is connected to the thin film transistor through the first contact hole 181 and receives the data voltage through the data line 171 when the thin film transistor is turned on.

The common electrode 270 overlaps the first electrode 135 and is connected to the first electrode 135 through the second contact hole 183. Accordingly, the common electrode 270 receives the predetermined voltage through the reference voltage line 131.

A liquid crystal layer made of liquid crystal molecules 310 is formed in the microcavities 305. The liquid crystal molecules 310 may be slanted or oriented in a horizontal direction with respect to the substrate 110. That is, a horizontal alignment may be realized. An alignment layer (not shown) to align the liquid crystal molecules 310 may be formed in the microcavities 305. The alignment layer may be formed to contact the pixel electrode 191 and the common electrode 270.

If the pixel electrode 191 receives the data voltage and the common electrode 270 receives another predetermined voltage, an electric field is generated between the pixel electrode 191 and the common electrode 270. Accordingly, the direction of the liquid crystal molecules 310 positioned in the microcavity 305 and the luminance of the light passing through the liquid crystal layer is altered depending on the induced direction of the liquid crystal molecules 310.

A horizontal electric field may be stably formed when the heights of the pixel electrode 191 and the common electrode 270 are larger than the corresponding thicknesses. More generally, the pixel electrode 191 and the common electrode 270 are formed to be relatively thin, and are oriented so that the resulting electric field has a significant horizontal component in addition to any vertical component that may exist. In the present exemplary embodiment, the pixel electrode 191 and the common electrode 270 are positioned on opposite sides of the liquid crystal molecules 310. The liquid crystal molecules 310 are thus controlled by a horizontal electric field generated between the pixel electrode 191 and the common electrode 270, thereby further realizing stable control.

A second insulating layer 350 may be further formed on the pixel electrode 191, the common electrode 270, and the microcavities 305. The second insulating layer 350 may be made of an inorganic insulating material such as silicon nitride ($SiN_x$) or silicon oxide ($SiO_x$), and may be omitted if necessary.

A roof layer 360 is formed on the second insulating layer 350. The roof layer 360 may be made of an organic material. The roof layer 360 is formed to cover a portion of the upper surface and the sides of each microcavity 305. The roof layer 360 may be hardened by a hardening process to maintain the shape of the microcavities 305.

The roof layer 360 is formed not to cover part of one side of each microcavity 305, and the uncovered part is referred to as an injection hole 307. In the manufacturing process of the display device, a portion of the microcavity 305 is exposed by the injection hole 307 such that an alignment material or the liquid crystal material may be injected into the microcavity 305 through the injection hole 307.

A third insulating layer 370 may be further formed on the roof layer 360. The third insulating layer 370 may be formed of an inorganic insulating material such as silicon nitride (SiNx) or silicon oxide (SiOx). The third insulating layer 370 may be formed to cover the upper surface and/ or the side of the roof layer 360. The third insulating layer 370 protects the roof layer 360 and may be omitted if necessary.

An overcoat 390 is formed on the third insulating layer 370. The overcoat 390 is formed to cover the injection hole 307 which exposed a portion of the microcavity 305. That is, the overcoat 390 may seal the microcavity 305 such that the liquid crystal molecules 310 contained in the microcavity 305 may not leak out. The overcoat 390 contacts the liquid crystal molecule 310, so it is preferable that the overcoat 390 be formed of a material that does not react with the liquid crystal molecule 310. For example, the overcoat 390 may be made of parylene.

The overcoat 295 may be a multilayer structure, such as a dual layer or a triple layer structure. The dual layer includes two layers made of different materials. The triple layer includes three layers, and materials of two adjacent layers are different from each other. For example, the overcoat 390 may include a layer made of an organic insulating material and a layer made of an inorganic insulating material.

Although not illustrated in the drawings, a polarizer may be further formed on upper and lower surfaces of the display device. The polarizer may be formed as both a first polarizer and a second polarizer. The first polarizer may be attached to a lower surface of the substrate 110, and the second polarizer may be attached to the overcoat 390.

Next, a method of manufacturing the display device according to an exemplary embodiment of the present invention will be described with reference to FIG. 4 to FIG. 17, as well as FIG. 1.

FIG. 4 to FIG. 17 are process cross-sectional views showing a method of manufacturing a display device according to an exemplary embodiment of the present invention. FIG. 4, FIG. 6, FIG. 8, FIG. 10, FIG. 12, FIG. 14, and FIG. 16 are the same cross-sectional views. FIG. 5, FIG. 7, FIG. 9, FIG. 11, FIG. 13, FIG. 15, and FIG. 17 are the same cross-sectional views.

Figure 4:
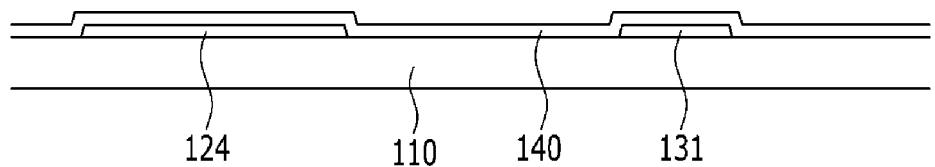
FIG. 4 to FIG. 17 are process cross-sectional views of a method of manufacturing a display device according to an exemplary embodiment of the present invention.
Figure 5:
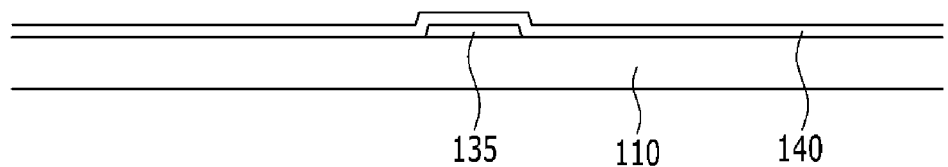

First, as shown in FIG. 4 and FIG. 5, a gate line 121 and a gate electrode 124 protruding from the gate line 121 are formed on a substrate 110 made of glass or plastic. The gate line 121 mainly extends in a horizontal direction.

Also, a reference voltage line 131 separated from the gate line 121, and a first electrode 135 protruding from the reference voltage line 131, are formed. The reference voltage line 131 and the first electrode 135 may be formed in the same process as the gate line 121 and may be made of the same material as the gate line 121.

The reference voltage line 131 may be formed in a direction parallel to the gate line 121. The first electrode 135 mainly extends in a vertical direction.

A gate insulating layer 140 is formed on the gate line 121, the gate electrode 124, the reference voltage line 131, and the first electrode 135. The gate insulating layer 140 may be made of an inorganic insulating material such as silicon nitride (SiNx) or silicon oxide (SiOx), and may be fabricated as a single layer or multiple layers.

Figure 6:
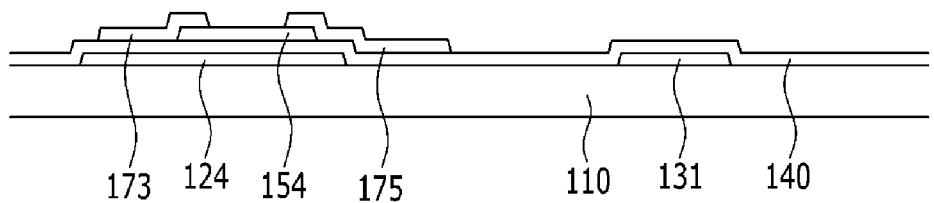
Figure 7:
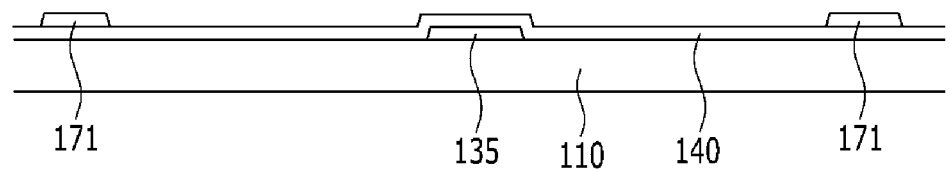

As shown in FIG. 6 and FIG. 7, a semiconductor material such as amorphous silicon, polycrystalline silicon, or metal oxide is deposited and patterned on the gate insulating layer 140 to form a semiconductor 154. The semiconductor 154 is formed to overlap the gate electrode 124.

Next, a metal material is deposited and patterned to form a data line 171, a source electrode 173, and a drain electrode 175. The metal material may be made of a single layer or multiple layers.

The data line 171 may be formed to extend in a substantially vertical direction, and the data line 171 may extend in a direction parallel to the first electrode 135.

The source electrode 173 is connected to the data line 171 and may be simply a portion of the data line 171. The source electrode 173 and the drain electrode 175 may be positioned on the gate electrode 124. The source electrode 173 and the drain electrode 175 are separated from each other on the gate electrode 124.

The semiconductor material and the metal material may be deposited and simultaneously patterned to form the semiconductor 154, the data line 171, the source electrode 173, and the drain electrode 175. In this case, the semiconductor 154 is also formed under the data line 171.

The gate electrode 124, the source electrode 173, and the drain electrode 175 collectively form the thin film transistor (TFT) along with the semiconductor 154.

Figure 8:
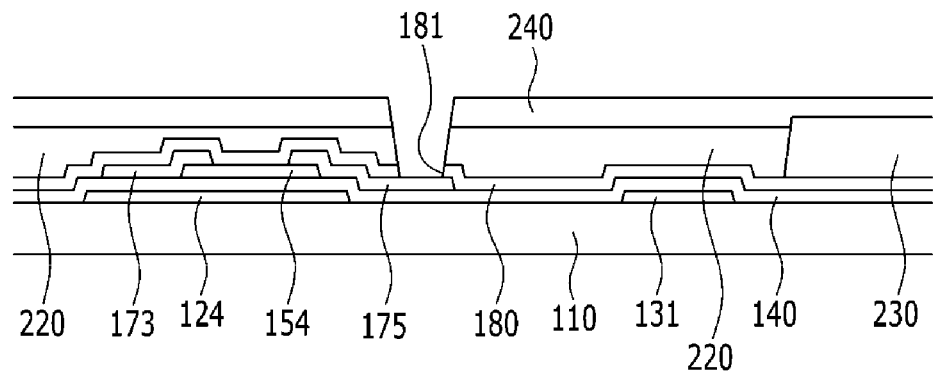
Figure 9:
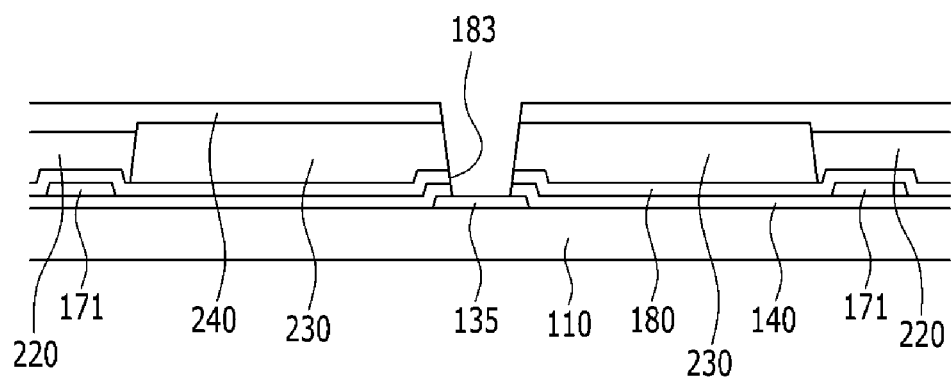

As shown in FIG. 8 and FIG. 9, a passivation layer 180 is formed on the data line 171, the source electrode 173, the drain electrode 175, and the semiconductor 154 exposed between the source electrode 173 and the drain electrode 175. The passivation layer 180 may be formed of an organic insulating material or an inorganic insulating material, and may be made of a single layer or multiple layers.

Next, color filters 230 are formed on the passivation layer 180. The color filters 230 are formed in each pixel, and color filters 230 having the same color may be formed in different pixels along a column direction. In the case of forming color filters 230 having three colors, a first color filter 230 having a first color may be formed first, then a second color filter 230 having a second color may be formed by shifting a mask, and then a third color filter 230 having a third color may be formed by shifting a mask.

Next, by using a material that can block light, a light blocking member 220 is formed on the passivation layer 180. The light blocking member 220 may be formed along the boundary of each pixel and may be formed on the thin film transistor. The light blocking member 220 may be formed to overlap the gate line 121, the reference voltage line 131, and the data line 171.

Next, a first insulating layer 240 is formed on the color filter 230 and the light blocking member 220. The first insulating layer 240 is formed of an organic insulating material, thereby flattening the upper surface of the color filter 230 and the light blocking member 220. Also, the first insulating layer 240 may be made of a dual layer, which includes a layer made of an organic insulating material and a layer made of an inorganic insulating material.

The passivation layer 180, the light blocking member 220, and the first insulating layer 240 are patterned to form a first contact hole 181 exposing at least a portion of the drain electrode 175. In addition, the gate insulating layer 140, the passivation layer 180, the color filter 230, and the first insulating layer 240 are patterned to form a second contact hole 183 exposing at least a portion of the first electrode 135.

Figure 10:
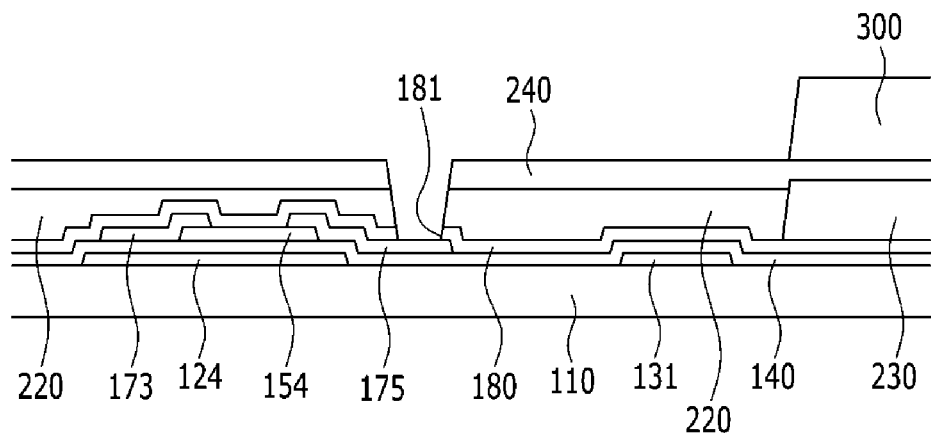
Figure 11:
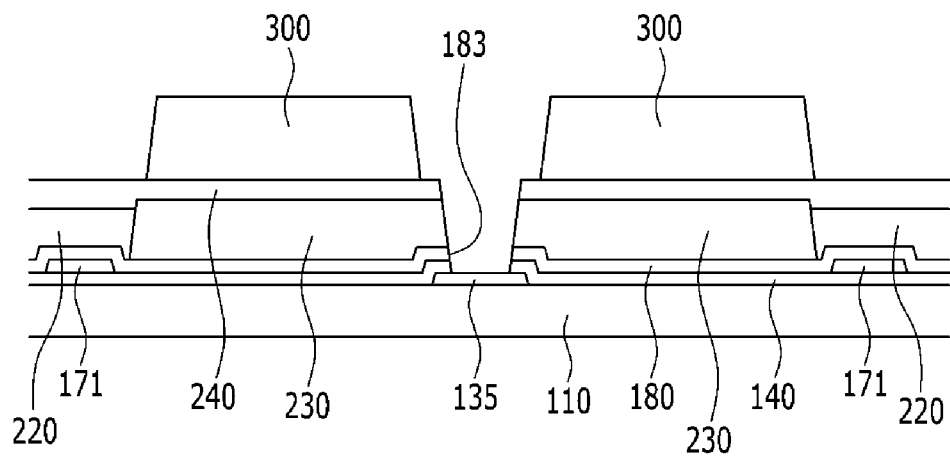

As shown in FIG. 10 and FIG. 11, a sacrificial layer 300 is formed on the first insulating layer 240. The sacrificial layer 300 is formed in each pixel. The sacrificial layer 300 is patterned so as not to be formed on the first electrode 135 and the data line 171. That is, the sacrificial layer 300 is removed from (or never deposited) over the first electrode 135 and the data line 171.

Figure 12:
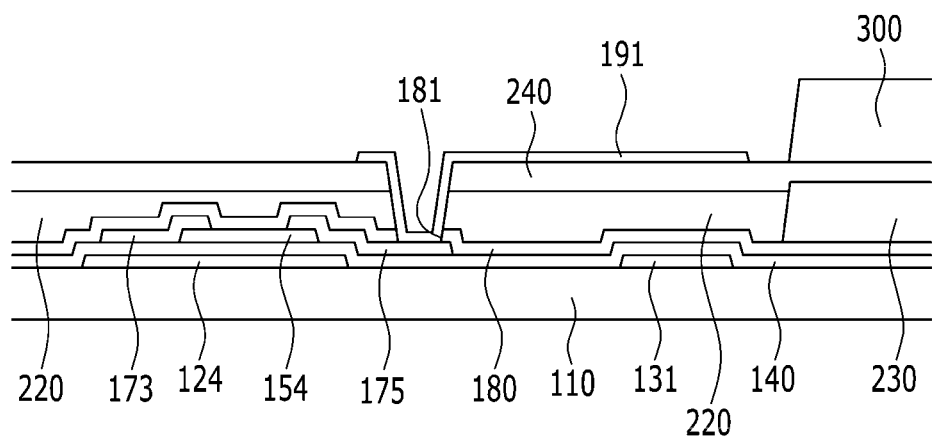
Figure 13:
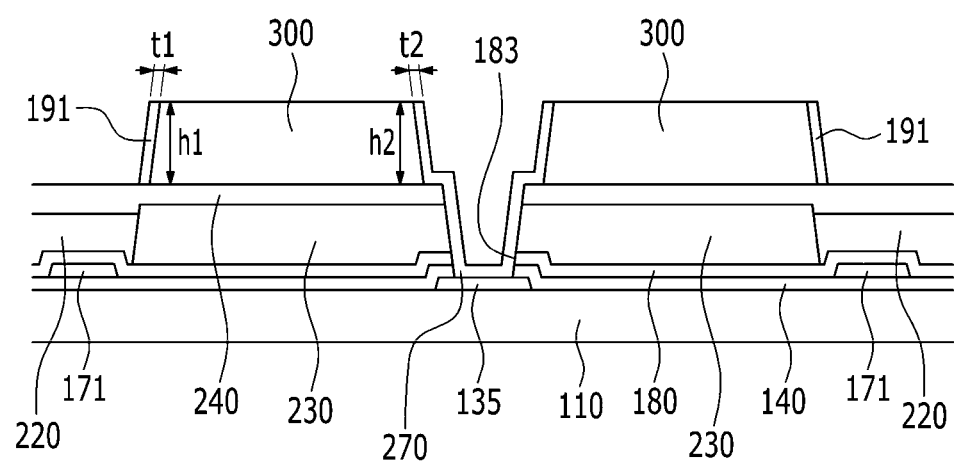

In FIG. 12, and as shown in FIG. 13, a transparent metal oxide such as indium-tin oxide (ITO) or indium-zinc oxide (IZO), or an opaque metal material, is deposited and patterned on the sacrificial layer 300 to form the pixel electrode 191 and the common electrode 270.

The pixel electrode 191 and the common electrode 270 are formed to cover the sides of the sacrificial layer 300. The pixel electrode 191 may be positioned at both edges of one pixel and mainly extends in a vertical direction. The pixel electrode 191 is formed to cover the side of the sacrificial layer 300 adjacent or proximate to the data line 171. The common electrode 270 may be positioned at the center of one pixel and mainly extends in a vertical direction. The common electrode 270 is formed to cover the sides of the sacrificial layer 300 adjacent to the first electrode 135.

The pixel electrode 191 and the common electrode 270 are formed in elongated bar shapes. The pixel electrode 191 and the common electrode 270 extend parallel to each other. Also, the pixel electrode 191 and the common electrode 270 may extend parallel to the data line 171 and may also extend parallel to the first electrode 135.

The height h1 of the pixel electrode 191 is larger than its thickness t1, and the height h2 of the common electrode 270 is larger than its thickness t2. The height h1 of the pixel electrode 191 and the height h2 of the common electrode 270 correspond to the height of the sacrificial layer 300.

The pixel electrode 191 is formed to overlap a portion of the drain electrode 175 and is connected to the drain electrode 175 through the first contact hole 181. The common electrode 270 is formed to overlap the first electrode 135 and is connected to the first electrode 135 through the second contact hole 183.

Figure 14:
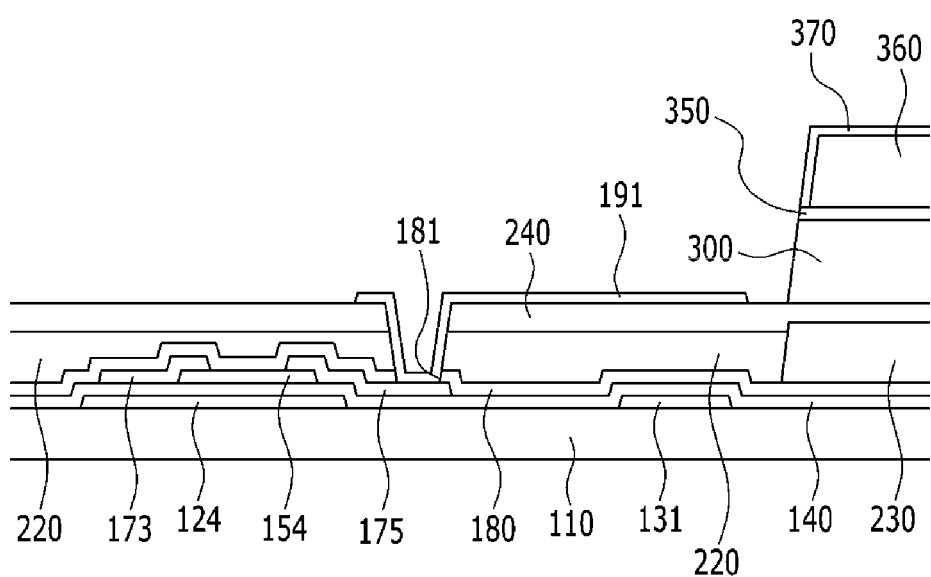
Figure 15:
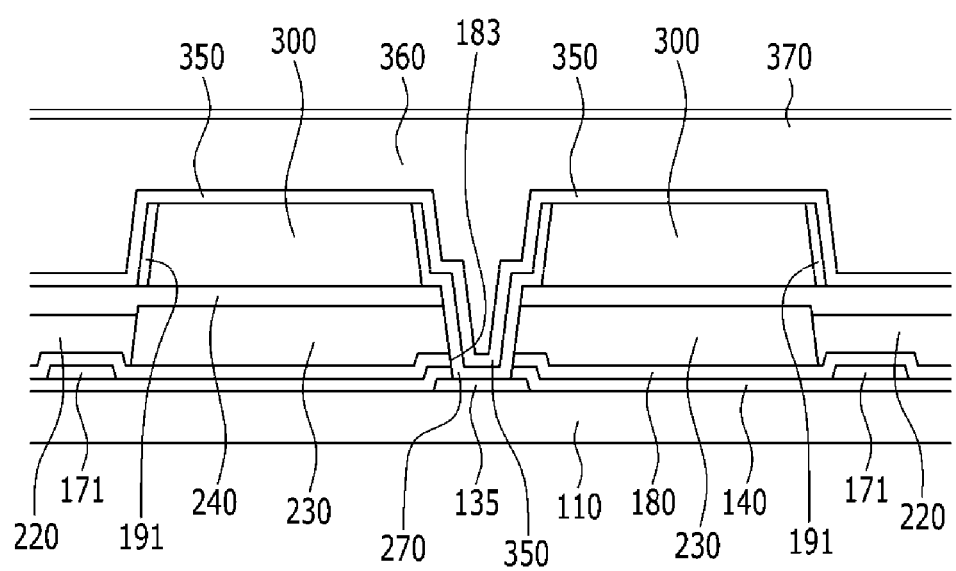

As shown in FIG. 14 and FIG. 15, a second insulating layer 350 is formed on the pixel electrode 191, the common electrode 270, and the sacrificial layer 300. The second insulating layer 350 may be made of an inorganic insulating material such as silicon oxide or silicon nitride.

Next, organic material is coated and patterned on the second insulating layer 350 to form a roof layer 360. The organic material may be patterned to remove a portion overlapping the gate line 121, the reference voltage line 131, and the thin film transistor.

The roof layer 360 is formed to cover a portion of the upper surface and the sides of the sacrificial layer 300. Also, the roof layer 360 is formed to cover the pixel electrode 191 and the common electrode 270. The roof layer 360 is formed so as not to cover (e.g., is removed from) the remaining portion of the side of the sacrificial layer 300.

After the roof layer 360 is formed, light is irradiated on the roof layer 360 to perform a curing process. If the curing process is performed, the roof layer 360 is hardened so that even if an empty space is formed beneath the roof layer 360, its shape may be maintained.

Next, a third insulating layer 370, made of an inorganic insulating material such as silicon nitride or silicon oxide, may be formed on the roof layer 360.

Figure 16:
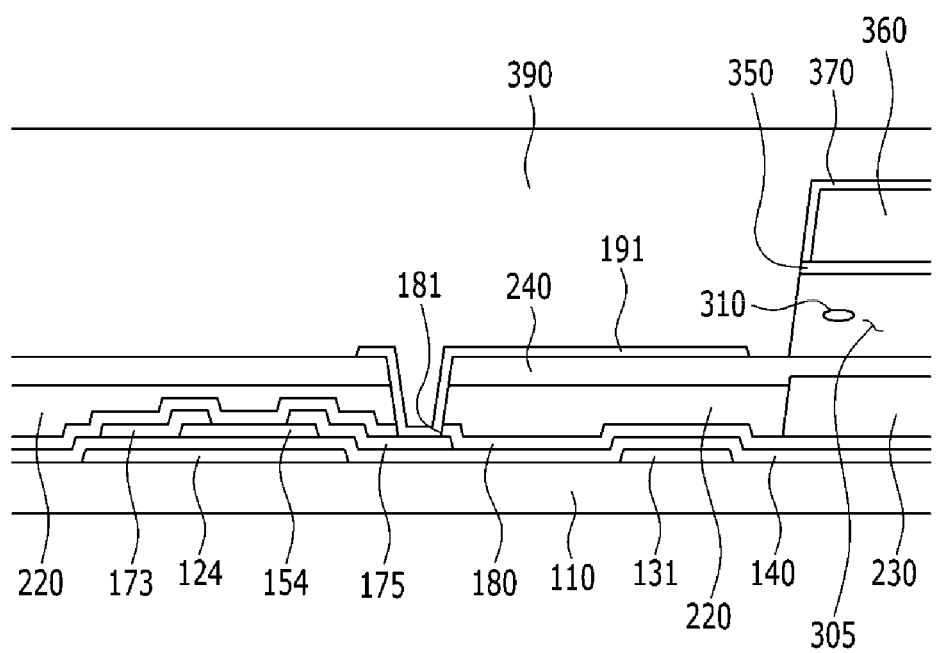
Figure 17:
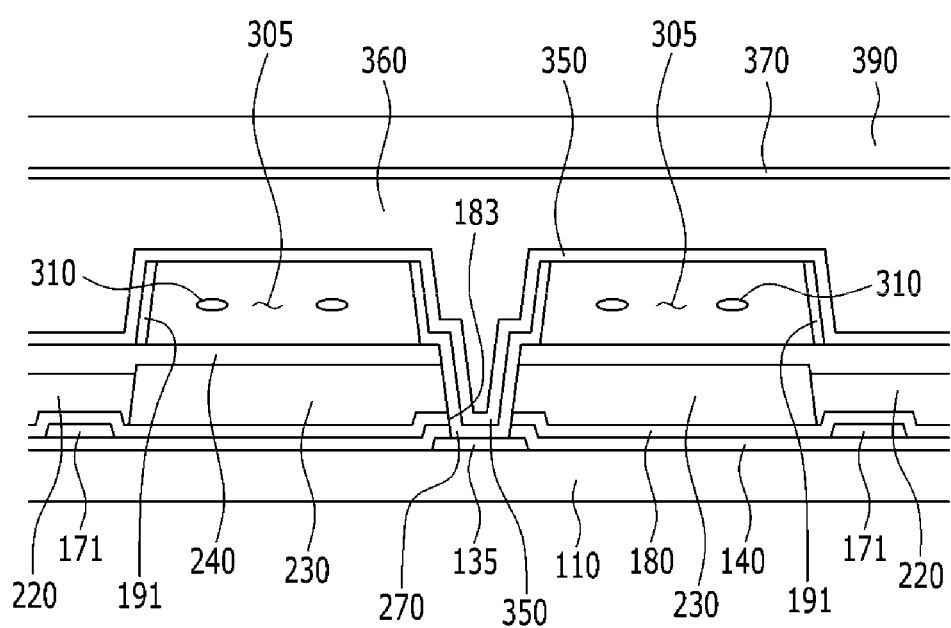

As shown in FIG. 16 and FIG. 17, the sacrificial layer 300 is fully removed by applying a developer or a stripper solution on the substrate 110 where the sacrificial layer 300 is exposed. The sacrificial layer 300 may also be fully removed by an ashing process.

When the sacrificial layer 300 is removed, the microcavities 305 are generated at a portion where the sacrificial layer 300 was positioned. The pixel electrode 191 and the common electrode 270 are respectively positioned at both sides of each microcavity 305, and each microcavity 305 is enclosed by its respective pixel electrode 191 and common electrode 270. That is, each microcavity 305 is positioned between a respective pixel electrode 191 and common electrode 270.

A portion of each microcavity 305 is exposed through the portions where the roof layer 360 is removed, and each exposed portion is referred to as an injection hole 307.

Next, an aligning agent containing an alignment material is dripped on the substrate 110 by a spin coating method or an inkjet method, and the aligning agent is injected into each microcavity 305 through the injection hole 307. After the aligning agent is injected into the microcavities 305, a hardening process is performed so that a solution component (i.e. a solvent) of the alignment material is evaporated and the alignment material remains at an inner wall of the microcavity 305, thereby forming an alignment layer (not shown).

Next, a liquid crystal material is dripped onto the substrate 110 by a spin coating method or an inkjet method, and the liquid crystal material is injected inside the microcavities 305 through the injection hole 307 by a capillary force. Accordingly, a liquid crystal layer made of the liquid crystal molecules 310 is formed inside each microcavity 305.

Next, a material that does not react with the liquid crystal molecule 310 is deposited to form an overcoat 390. The overcoat 390 is formed to cover the injection hole 307 to seal the microcavities 305, such that the liquid crystal molecules 310 formed inside the microcavity 305 do not leak out from the microcavities 305.

Next, although not illustrated, polarizers may be further attached to upper and lower sides of the display device. The polarizers may include a first polarizer and a second polarizer. The first polarizer may be attached to the lower side of the substrate 110, and the second polarizer may be attached to the overcoat 390.

Next, the display device according to an exemplary embodiment of the present invention will be described with reference to FIG. 18.

Figure 2:
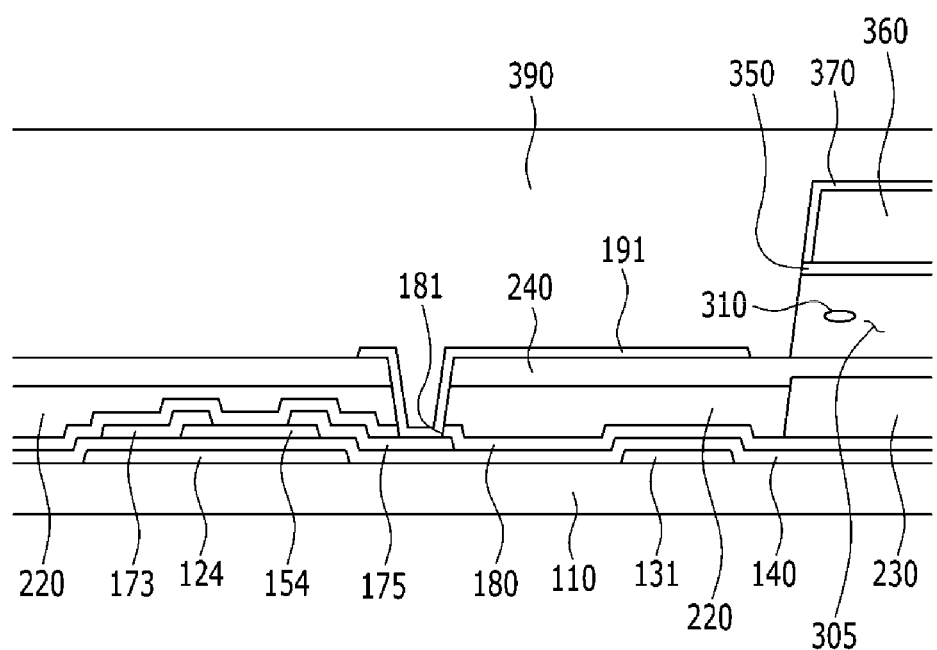
FIG. 2 is a cross-sectional view of a display device according to an exemplary embodiment of the present invention of FIG. 1, taken along line II-II.
Figure 18:
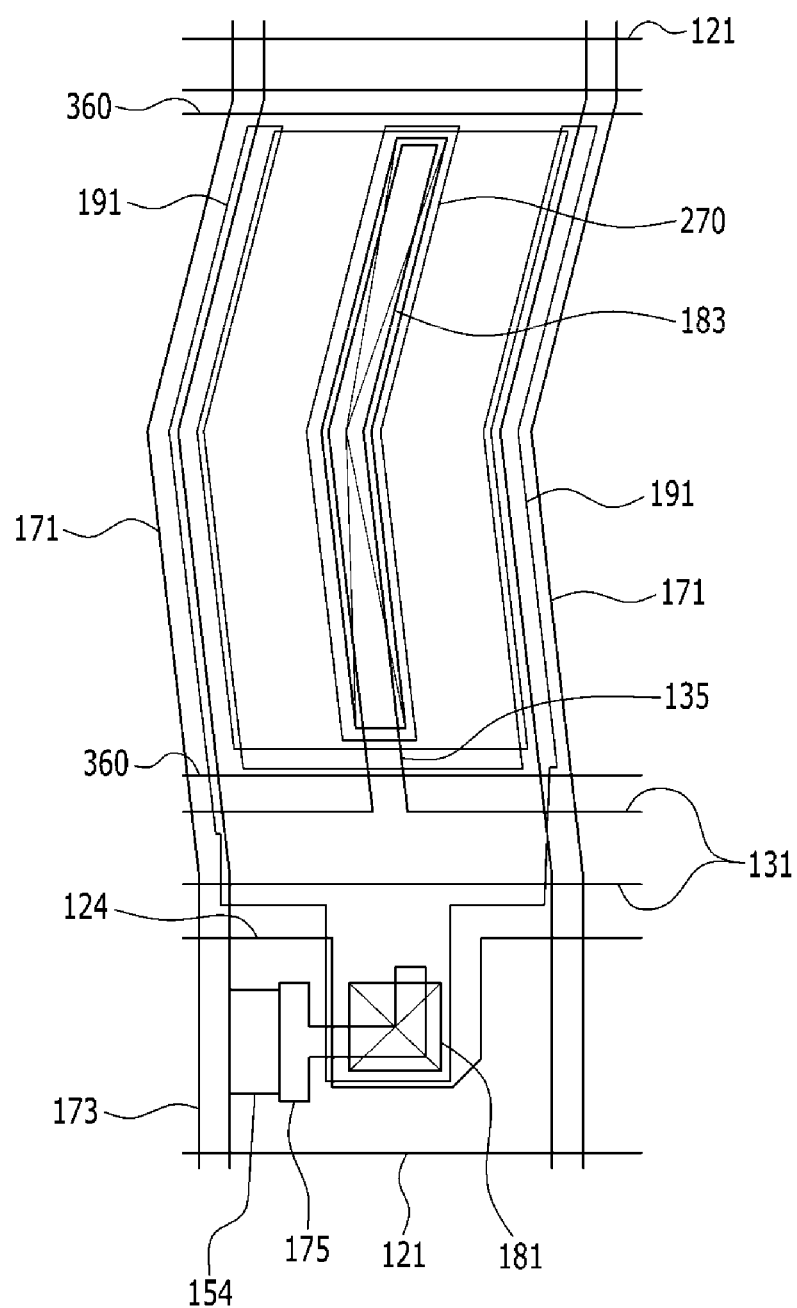
FIG. 18 is a plan view of one pixel of a display device according to an exemplary embodiment of the present invention.

The display device according to an exemplary embodiment of the present invention shown in FIG. 18 is substantially the same as the display device according to an exemplary embodiment of the present invention shown in FIG. 1 to FIG. 3. In the present exemplary embodiment, the pixel electrode and the common electrode may have a shape that is bent, unlike the previous exemplary embodiment.

FIG. 18 is a plan view of one pixel of a display device according to an exemplary embodiment of the present invention.

Like the previous exemplary embodiment, the pixel electrode 191 and the common electrode 270 extend in parallel.

While the pixel electrode 191 and the common electrode 270 extend in one direction inside one pixel in the previous exemplary embodiment, the pixel electrode 191 and the common electrode 270 of the present embodiment have a shape with a bend in each pixel area. As shown in FIG. 18, the pixel electrode 191 and the common electrode 270 may have a shape that is bent one time in the center of one pixel. As a result, one pixel may be divided into two domains with respect to the portion in which the pixel electrode 191 and the common electrode 270 are bent. In the two domains, the alignment directions of the liquid crystal molecules 310 are different from each other, thereby improving the visibility of the display device.

The data line 171 extends in a direction parallel to the pixel electrode 191 and the common electrode 270. Accordingly, like the pixel electrode 191 and the common electrode 270, the data line 171 has a bend at each pixel, i.e. has two different portions extending in two different directions for each pixel area.

In the present exemplary embodiment, the pixel electrode 191 and the common electrode 270 are bent one time in each pixel. However, the present invention is not limited thereto. Instead, the pixel electrode 191 and the common electrode 270 may be bent two or more times.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims. Various features of the above described and other embodiments can be mixed and matched in any manner, to produce further embodiments consistent with the invention.

| <Description of symbols> | |
|---|---|
| 121: gate line | 131: reference voltage line |
| 135: first electrode | 171: data line |
| 191: pixel electrode | 270: common electrode |
| 300: sacrificial layer | 305: microcavity |
| 307: injection hole | 310: liquid crystal molecule |
| 360: roof layer | 390: overcoat |

What is claimed is:

1. A display device comprising:
a substrate;
a thin film transistor disposed on the substrate;
a microcavity having a first side, a second side opposite to the first side, and an upper surface extending between the first side and the second side, the first side and the second side extending at a predetermined angle with respect to a surface of the substrate;
a pixel electrode connected to the thin film transistor and positioned along the first side;
a common electrode extending along the second side;
a roof layer covering the pixel electrode, the common electrode, and the upper surface of the microcavity; and
a liquid crystal layer disposed in the microcavity.

2. The display device of claim 1, further comprising:
a gate line, a reference voltage line, and a data line positioned on the substrate; and
a first electrode protruding from the reference voltage line and overlapping the common electrode,
wherein the common electrode is connected to the first electrode.

3. The display device of claim 2, wherein:
the reference voltage line is positioned in the same layer as the gate line and extends in a direction parallel to the gate line.

4. The display device of claim 3, wherein:
the data line extends in a direction parallel to the pixel electrode and the common electrode.

5. The display device of claim 1, wherein:
the common electrode is positioned in the same layer as the pixel electrode.

6. The display device of claim 1, wherein:
a height of the pixel electrode is greater than a thickness of the pixel electrode.

7. The display device of claim 1, wherein:
a height of the common electrode is greater than a thickness of the common electrode.

8. The display device of claim 1, wherein the microcavity is a first microcavity, the display device further comprises a second microcavity having a first side and an opposite second side, the pixel electrode is positioned along the first side of the second microcavity, and the common electrode is positioned along the second side of the second microcavity.

9. The display device of claim 1, wherein:
the pixel electrode and the common electrode each have a first portion oriented along a first direction and a second portion connected to the first portion and oriented along a second direction different from the first direction.

10. The display device of claim 9, wherein:
the data line has a first portion oriented along a first direction and a second portion connected to the first portion and oriented along a second direction different from the first direction.

* * * * *